(12) United States Patent
Kirby (10) Patent No.: US 6,937,099 B2
(45) Date of Patent: Aug. 30, 2005

(54) OP-AMP CONFIGURABLE IN A NON-INVERTING MODE WITH A CLOSED LOOP GAIN GREATER THAN ONE WITH OUTPUT VOLTAGE CORRECTION FOR A TIME VARYING VOLTAGE REFERENCE OF THE OP-AMP, AND A METHOD FOR CORRECTING THE OUTPUT VOLTAGE OF SUCH AN OP-AMP FOR A TIME VARYING VOLTAGE REFERENCE

(75) Inventor: Patrick C. Kirby, Limerick (IE)

(73) Assignee: Analog Devices, Inc., Norwood, MA (US)

( * ) Notice: Subject to any disclaimer, the term of this patent is extended or adjusted under 35 U.S.C. 154(b) by 0 days.

(21) Appl. No.: 10/728,053

(22) Filed: Dec. 4, 2003

(65) Prior Publication Data

US 2005/0122170 A1 Jun. 9, 2005

(51) Int. Cl.[7] .................................. H03F 3/45
(52) U.S. Cl. ........................... 330/253; 330/69
(58) Field of Search ............... 330/69, 85, 86, 330/253, 254, 260, 282, 291, 307

(56) References Cited

U.S. PATENT DOCUMENTS

| | | | | |
|---|---|---|---|---|
| 4,162,456 A | * | 7/1979 | Lukes ........................ | 330/69 |
| 4,263,561 A | | 4/1981 | Weber | |
| 5,155,450 A | | 10/1992 | Schultz | |
| 5,510,751 A | * | 4/1996 | Nauta ........................ | 330/84 |
| 6,091,294 A | * | 7/2000 | Shirai et al. ................ | 330/69 |
| 6,175,254 B1 | | 1/2001 | Corio | |

FOREIGN PATENT DOCUMENTS

EP 0744829 11/1996
EP 0809353 11/1997

OTHER PUBLICATIONS

PCT/IE2004/000153 international search report.

* cited by examiner

Primary Examiner—Khanh V. Nguyen
(74) Attorney, Agent, or Firm—Wolf, Greenfield & Sacks, P.C.

(57) ABSTRACT

A circuit (1) comprising eight DACs (2a to 2h), the analog outputs of which are applied to the non-inverting inputs (6) of corresponding op-amps (7a to 7h) for gaining up the analog output voltage from the corresponding DAC (2). The op-amps (7) are identical, and are configured in a non-inverting mode with a closed loop gain of two provided by first and second resistors ($R_1$) and ($R_2$). Primary outputs (8) of the op-amps (7) are coupled to output pins (9a to 9h) of the circuit (1). The second resistors ($R_2$) couple primary inverting inputs (12) of the op-amps (7) to a common lo voltage reference rail (14), which is coupled to a true ground reference pin (15) through a coupling wire (16) which exhibit a combined inherent resistance ($R_p$). The voltage reference on the common voltage reference rail (14) varies with time as the output signals of the pa-amps (7) vary, and would thus result in cross-talk between the DACs (2a to 2h). Each op-amp (7) comprises a secondary differential input amplifier stage (36), the non-inverting and inverting inputs (37,38) of which are coupled to the common voltage reference rail (14) and the ground reference pin (15), respectively. The secondary differential input stage (36) provides a secondary current to a node (29) in the op-amp (7) in response to variation in the time varying voltage reference for summing with an intermediate current provided through the node (29) by a primary differential input amplifier stage (25) of the op-amp (7) for correcting the output voltage signal on the primary output (8) for variation in the voltage reference on the common voltage reference rail (14).

27 Claims, 5 Drawing Sheets

OP-AMP CONFIGURABLE IN A NON-INVERTING MODE WITH A CLOSED LOOP GAIN GREATER THAN ONE WITH OUTPUT VOLTAGE CORRECTION FOR A TIME VARYING VOLTAGE REFERENCE OF THE OP-AMP, AND A METHOD FOR CORRECTING THE OUTPUT VOLTAGE OF SUCH AN OP-AMP FOR A TIME VARYING VOLTAGE REFERENCE

FIELD OF THE INVENTION

The present invention relates to an operational amplifier (op-amp) configurable in a non-inverting mode with a closed loop gain greater than one, and with correction in an output signal of the op-amp for a time varying voltage reference of the o amp relative to a true voltage reference. The invention also relates to a circuit comprising a plurality of the op-amps each configured in a non-inverting mode with a closed loop gain greater than one wherein the op-amps are referenced to a common voltage reference rail on which the voltage reference is a time varying voltage reference relative to a true voltage reference, and correction for the time varying voltage reference is provided in the output signals of the respective op-amps. The invention further relates to a method for providing correction in an output signal of an op-amp, configured in a non-inverting mode with a closed loop gain greater than one, for a time varying voltage reference of the op-amp relative to a true voltage reference.

BACKGROUND TO THE INVENTION

Integrated circuits, for example, CMOS circuits, with a plurality of op-amps configured in a non-inverting mode with a closed loop gain greater than one are common. For example, in circuits which comprise a plurality of digital-to-analog converters (DACs), the analog output voltages from the DACs are gained up in corresponding op-amps which are configured in a non-inverting mode with a closed loop gain greater than one. In such circuits the analog output of each DAC is applied to the non-inverting input of the corresponding op-amp. A common voltage reference rail is provided in such circuits to provide a voltage reference, typically a ground reference for the op-amps. The op-amps each comprise a feedback circuit having a first impedance element coupled between the op-amp output and the inverting input of the op-amp. A second impedance element couples the inverting input of the corresponding op-amp to the common voltage rail. The first and second impedance elements of each op-amp, which typically are resistive elements, are selected to provide the desired closed loop gain for the op-amp.

In general, the common voltage reference rail is coupled to a voltage reference pin, typically, a ground pin which is provided for coupling the integrated circuit to an external voltage reference, such as a true external ground. However, the coupling between the common voltage reference rail and the ground pin typically exhibits an inherent parasitic impedance, typically, an inherent resistance. The common voltage reference rail is coupled to the pin by a coupling wire, and solder joints are required at the respective opposite ends of the coupling wire for connecting the coupling wire to the common voltage reference rail and the ground pin. The coupling wire itself will have an inherent resistance, and the joints, typically, solder joints which connect the coupling wire to the common voltage reference rail and the ground pin also will exhibit an inherent resistance. Accordingly, when current flows between the common voltage reference rail and the ground pin, a voltage drop develops between the common voltage reference rail and the ground pin. The voltage drop is proportional to the current flowing between the common voltage reference rail and the ground pin. Since the output voltage signals of the respective op-amps vary in response to a change in voltage of input signals to the op-amps, as the digital input words to the respective DACs change with time, the current flowing through the coupling between the common voltage reference rail and the ground pin also varies with time. Accordingly, a time varying voltage is induced on the common voltage reference rail relative to the true ground applied to the ground pin. This, thus, causes the voltage reference on the common voltage reference rail to be a time varying voltage reference. The time varying voltage reference on the common voltage reference rail leads to cross-talk between the outputs of the op-amps, since a change in the digital input word to any one of the DACs affects the output voltages of the op-amps of the other DACs. This is undesirable.

There is therefore a need for an op-amp configured in a non-inverting mode with a closed loop gain greater than one, in which the output signal from the op-amp includes a correction for a time varying voltage reference of the op-amp relative to a true voltage reference for in turn minimising the effect of cross-talk between a plurality of op-amps sharing the same time varying voltage reference. Indeed, there is also a need for an op-amp which is configurable in a non-inverting mode with a closed loop gain greater than one in which the output signal of the op-amp includes a correction for a time varying voltage reference relative to a true voltage reference.

The present invention is directed towards an op-amp configurable in a non-inverting mode with a closed loop gain greater than one with an output signal of the op-amp including a correction for a time varying voltage reference of the op-amp relative to a true voltage reference. The invention is also directed towards a method for providing correction in an output signal of an op-amp configured in a non-inverting mode with a closed loop gain greater than one for a time varying voltage reference of the op-amp relative to a true voltage reference. The invention is also directed towards a circuit comprising a plurality of op-amps, with each op-amp configured in a non-inverting mode with a closed loop gain greater than one and referenced to a time varying voltage reference relative to a true voltage reference, with correction in an output signal of each op-amp for the time varying voltage reference for minimising cross-talk between the outputs of the respective op-amps.

SUMMARY OF THE INVENTION

According to the invention there is provided an operational amplifier (op-amp) configurable in a non-inverting mode with a closed loop gain greater than one, and with correction in an output signal of the op-amp for a time varying voltage reference of the op-amp relative to a true voltage reference, the op-amp comprising:

a primary output for providing the output signal gained up from an input signal, a primary differential input amplifier stage operable with a transconductance and having a non-inverting input defining a primary non-inverting input of the op-amp for receiving the input signal, an inverting input defining a primary inverting input of the op-amp for coupling to a feedback loop from the primary output, and an output for providing an intermediate current signal from which the output signal on the primary output is derived, and a secondary differential input amplifier stage operable with a transconductance, and responsive to the time varying voltage reference for providing a secondary current signal responsive to variation in the time varying voltage reference relative to the true voltage reference for summing with the intermediate current signal provided by the primary differential input amplifier stage, the transconductance of the secondary differential input amplifier stage being a function of the transconductance of the primary differential input amplifier stage, so that the output signal on the primary output derived from the sum of the intermediate and secondary currents includes correction for the time varying voltage reference.

In one embodiment of the invention the secondary differential input amplifier stage comprises a non-inverting input for coupling to the time varying voltage reference, and an inverting input for coupling to the true voltage reference. Preferably, the secondary differential input amplifier stage comprises an output for providing the secondary current signal, the output of the secondary differential input amplifier stage being coupled to the output of the primary differential input amplifier stage.

In one embodiment of the invention the transconductance of the secondary differential input amplifier stage is a function of the closed loop gain of the op-amp and the transconductance of the primary differential input amplifier stage. Preferably, the transconductance of the secondary differential input amplifier stage is substantially equal to the transconductance of the primary differential input amplifier stage less the quotient of the transconductance of the primary differential input amplifier stage divided by the closed loop gain of the op-amp.

In a further embodiment of the invention the op-amp is configured with a closed loop gain greater than one, and a feedback loop comprising a first impedance element is provided coupling the primary output and the primary inverting input of the op-amp, a second impedance element being provided for coupling the primary inverting input with the time varying voltage reference, the second impedance element co-operating with the first impedance element for setting the closed loop gain of the op-amp.

In one embodiment of the invention the ratio of the impedance of the first impedance element to the impedance of the second impedance element is approximately 1.

Preferably, each of the first and second impedance elements are resistive elements.

In one embodiment of the invention the primary differential input stage of the op-amp comprises:

a first differential pair having a first transistor, a gate of which defines the primary non-inverting input, and a second transistor, a gate of which defines the primary inverting input, a first current mirror circuit coupled to the first differential pair and defining with the first transistor a first node, and with the inverting transistor a second node, the first node defining the output of the primary differential input amplifier stage, and a first constant current source for providing a constant current to the first differential pair.

In another embodiment of the invention the secondary differential input amplifier stage comprises:

a second differential pair having a third transistor, a gate of which defines the non-inverting input of the secondary differential input amplifier stage, and a fourth transistor, a gate of which defines the inverting input of the secondary differential input amplifier stage, the differential pair being coupled to a current mirror circuit, which defines with the third transistor a third node, and with the fourth transistor a fourth node, the third node defining the output of the secondary differential input amplifier stage, and being coupled to the first node of the primary differential input amplifier stage, and a second constant current source for providing a constant current to the second differential amplifier pair.

Preferably, the fourth node of the secondary differential input amplifier stage is coupled to the second node of the primary differential input amplifier stage.

Advantageously, the current mirror circuit to which the second differential pair is coupled is the first current mirror circuit of the primary differential input amplifier stage.

In one embodiment of the invention the op-amp is implemented as an integrated circuit by a CMOS process.

Additionally the invention provides an op-amp configured in a non-inverting mode with a closed loop gain greater than one, and referenced to a time varying voltage reference relative to a true voltage reference, with correction in an output signal of the op-amp for the time varying voltage reference, the op-amp comprising:

a primary output for providing the output signal gained up from a corresponding input signal, a primary differential input amplifier stage operable with a transconductance and having a non-inverting input defining a primary non-inverting input of the op-amp for receiving the corresponding input signal, an inverting input defining a primary inverting input of the op-amp, and an output for providing an intermediate current signal from which the output signal on the corresponding primary output is derived, a feedback loop coupling the primary output with the primary inverting input, a secondary differential input amplifier stage operable with a transconductance, and responsive to the time varying voltage reference for providing a secondary current signal responsive to variation in the time varying voltage reference relative to the true voltage reference for summing with the intermediate current signal provided by the primary differential input amplifier stage, the transconductance of the secondary differential input amplifier stage of the op-amp being a function of the transconductance of the primary differential input amplifier stage of the op-amp, so that the output signal on the primary output of the op-amp, which is derived from the sum of the corresponding intermediate and secondary currents includes correction for the time varying voltage reference.

In one embodiment of the invention the feedback loop comprising a first impedance element, and a second impedance element is provided for coupling the primary inverting input with the time varying voltage reference, the second impedance element co-operating with the first impedance element for setting the closed loop gain of the op-amp. Preferably, each of the first and second impedance elements are resistive elements.

The invention also provides a circuit comprising a plurality of op-amps, each op-amp being configured in a non-inverting mode with a closed loop gain greater than one, and referenced to a time varying voltage reference relative to a true voltage reference, with correction in an output signal of each op-amp for the time varying voltage reference, each op-amp comprising:

a primary output for providing the output signal gained up from a corresponding input signal, a primary differential input amplifier stage operable with a transconductance and having a non-inverting input defining a primary non-inverting input of the op-amp for receiving the corresponding input signal, an inverting input defining a primary inverting input of the op-amp, and an output for providing an intermediate current signal from which the output signal on the corresponding primary output is derived, a feedback loop coupling the primary output with the primary inverting input, a secondary differential input amplifier stage operable with a transconductance, and responsive to the time varying voltage reference for providing a secondary current signal responsive to variation in the time varying voltage reference relative to the true voltage reference for summing with the intermediate current signal provided by the primary differential input amplifier stage, the transconductance of the secondary differential input amplifier stage of each op-amp being a function of the transconductance of the primary differential input amplifier stage of the corresponding op-amp, so that the output signal on the primary output of the corresponding op-amp, which is derived from the sum of the corresponding intermediate and secondary currents includes correction for the time varying voltage reference.

In one embodiment of the invention a plurality of digital-to-analog converters are provided corresponding the respective op-amps, each digital-to-analog converter having an analog output for outputting an analog signal corresponding to a respective digital input word, the analog output of each digital-to-analog converter being coupled to the primary non-inverting input of the corresponding op-amp, so that the output signal provided by each op-amp is gained up from the analog signal of the corresponding digital-to-analog converter with correction for the time varying voltage reference.

In another embodiment of the invention a common voltage reference rail is provided, and the op-amps are referenced to the common voltage reference rail, the common voltage reference rail being coupled to the true voltage reference through a coupling means having inherent impedance, so that as the output signals through the primary outputs of the respective op-amps vary in response to variation in the corresponding input signals, current through the coupling means varies, thereby inducing the time varying voltage reference in the common voltage reference rail.

In one embodiment of the invention the circuit is implemented as an integrated circuit by a CMOS process, the circuit comprising a voltage reference pin to which the true voltage reference is applied.

The invention further provides a method for providing correction in an output signal of an op-amp, configured in a non-inverting mode with a closed loop gain greater than one, for a time varying voltage reference of the op-amp relative to a true voltage reference, the op-amp comprising a primary output for providing the output signal gained up from an input signal, and a primary differential input amplifier stage operable with a transconductance and having a non-inverting input defining a primary non-inverting input of the op-amp for receiving the input signal, an inverting input defining a primary inverting input of the op-amp for coupling to a feedback loop from the primary output, and an output for providing an intermediate current signal from which the output signal on the primary output is derived, the method comprising the steps of:

providing a secondary differential input amplifier stage operable with a transconductance, and responsive to the time varying voltage reference for providing a secondary current signal responsive to variation in the time varying voltage reference relative to the true voltage reference for summing with the intermediate current signal provided by the primary differential input amplifier stage, and selecting the transconductance of the secondary differential input amplifier stage to be a function of the transconductance of the primary differential input amplifier stage, so that the output signal on the primary output derived from the sum of the intermediate and secondary currents includes correction for the time varying voltage reference.

Preferably, the secondary differential input amplifier stage is provided with a non-inverting input, an inverting input and an output, and the method further comprises coupling the non-inverting input of the secondary differential input amplifier stage to the time varying voltage reference, coupling the inverting input of the secondary differential input amplifier stage to the true voltage reference, and coupling the output of the secondary differential input amplifier stage to the output of the primary differential input amplifier stage for summing the secondary current signal responsive to the time varying voltage reference through the output of the secondary differential input amplifier stage with the intermediate current signal through the output of the primary differential input amplifier stage.

Advantageously, the transconductance of the secondary differential input amplifier stage is selected to be a function of the closed loop gain of the op-amp and the transconductance of the primary differential input amplifier stage. Ideally, the transconductance of the secondary differential input amplifier stage is selected to be substantially equal to the transconductance of the primary differential input amplifier stage less the quotient of the transconductance of the primary differential input amplifier stage divided by the closed loop gain of the op-amp.

In one embodiment of the invention the feedback loop is provided and comprises a first impedance element coupled to the primary output and the primary inverting input of the op-amp, and a second impedance element couples the primary inverting input of the op-amp with the time varying voltage reference, the second impedance element co-operating with the first impedance element for setting the closed loop gain of the op-amp.

ADVANTAGES OF THE INVENTION

The advantages of the invention are many. Since the op-amp according to the invention when configured in a non-inverting mode with a closed loop gain greater than one includes in its output signal a correction for a time varying voltage reference of the op-amp relative to a true voltage reference, the output signal of the op-amp is reasonably stable over time, with the time variation in the voltage reference having little or no effect on the output signal. Thus, the op-amp according to the invention is particularly suitable for use in an integrated circuit with a plurality of other op-amps, all of which share the same time varying voltage reference. Furthermore, in an integrated circuit comprising a plurality of the op-amps according to the invention, all of which share the same time varying voltage reference, by virtue of the fact that the output signals of the op-amps include correction for the time varying voltage reference relative to the true voltage reference, cross-talk between the outputs of the op-amps is minimised. However, while the output signal of the op-amp according to the invention includes correction for a time varying voltage reference of the op-amp relative to a true voltage reference, in general, the correction does not entirely eliminate the effect of the time varying voltage reference on the output signal. However, the effect of the time varying voltage reference on the output signal is significantly reduced, and in some cases, depending on the closed loop gain of the op-amp, may be substantially entirely eliminated.

The invention and its advantages will be more clearly understood from the following description of a preferred embodiment thereof, which is given by way of example only, with reference to the accompanying drawings.

BRIEF DESCRIPTION OF THE DRAWINGS

FIG. 3 is a circuit diagram of the op-amp of FIG. 2, FIGS. 4(a) to 4(c) are waveforms of voltage signals resulting from computer simulated comparative tests comparing the performance of an op-amp according to the invention with that of a prior art op-amp.

DETAILED DESCRIPTION OF A PREFERRED EMBODIMENT OF THE INVENTION

Figure 1:
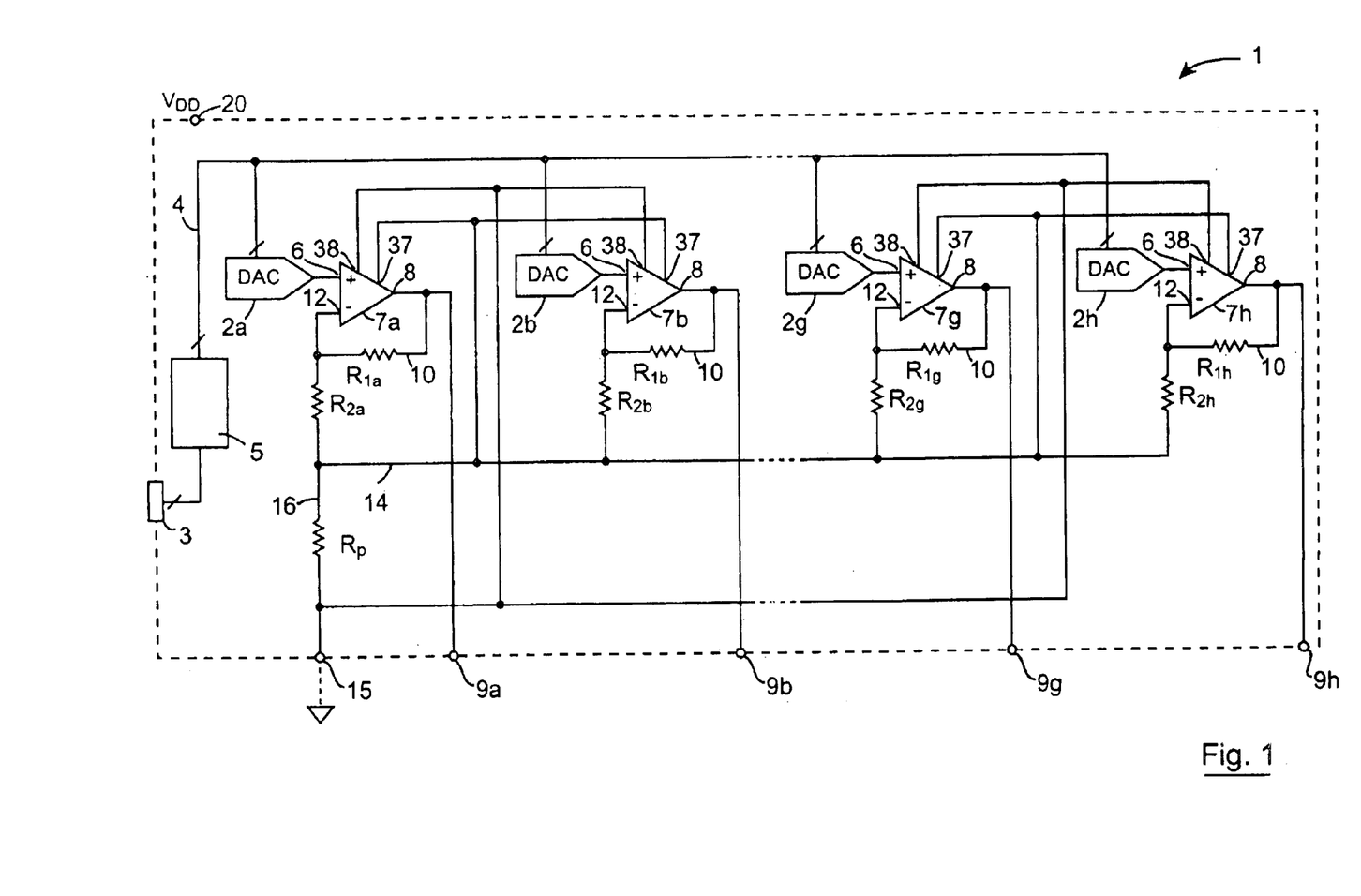
FIG. 1 is a block representation of a circuit according to the invention comprising a plurality of op-amps also according to the invention configured in a non-inverting mode with a closed loop gain greater than one in which an output signal of the op-amps includes correction for a time varying voltage reference of the op-amps relative to a true voltage reference.

Referring to the drawings, and initially to FIG. 1, there is illustrated an integrated circuit according to the invention indicated generally by the reference numeral 1 for converting digital data into analog voltage signals. The circuit 1 is implemented by a CMOS process, and comprises a plurality of DACs, in this embodiment of the invention eight DACs 2a to 2h, although only four of the DACs 2 are illustrated. The DACs 2a to 2h are independent of each other and convert respective digital words received from external circuits (not shown) to corresponding analog output signals. The digital words from the external circuits are received through a digital input port 3, and are addressed to the respective DACs 2 on a digital bus 4 under the control of a digital interface and control circuit 5. The operation of such digital interface circuits will be well known to those skilled in the art, and it is not intended to describe the interface circuit 5, nor is it intended to describe the operation of the DACs 2 in any further detail, since the operation of the DACs 2 will be well understood by those skilled in the art.

The analog output signal of each DAC 2a to 2h is applied to a primary non-inverting input 6 of a corresponding op-amp 7 which is configured in a non-inverting mode with a closed loop gain greater than one. The eight op-amps 7 corresponding to the eight DACs 2a to 2h are identified by the reference numerals 7a to 7h, respectively. The op-amps 7 are all according to the invention, and in this embodiment of the invention are identical to each other with the closed loop gain of each op-amp 7 being two.

Each op-amp 7 comprises a primary output 8 which provides an output voltage signal in response to the input analog voltage signal applied to its primary non-inverting input 6 by the corresponding DAC 2. The primary outputs 8 of the respective op-amps 7 are coupled to corresponding output pins 9a to 9h on which the output voltage signals are provided from the circuit 1.

A feedback loop 10 of each op-amp 7 comprises a first impedance element, namely, a first resistor $R_1$ which couples the primary output 8 of the op-amp 7 to a primary inverting input 12 of the corresponding op-amp 7. The primary inverting input 12 of each op-amp 7 is coupled to a common voltage reference rail 14 by a corresponding second impedance element, namely, a second resistor $R_2$, which with the first resistor $R_1$ sets the gain of the op-amp 7. The resistance values of the first and second resistors $R_1$ and $R_2$ of each op-amp 7 are equal to each other for setting the gain of each of the op-amps 7 equal to two. The respective first and second resistors $R_1$ and $R_2$ of the respective op-amps 7a to 7h are identified as resistors $R_{1a}$ to $R_{1h}$ and $R_{2a}$ to $R_{2h}$, respectively.

The common voltage reference rail 14 is coupled to a ground reference pin 15 by a coupling wire 16. The ground reference pin 15 in use is coupled to a true ground reference. However, the coupling wire 16 is connected to the common voltage reference rail 14 and to the ground reference pin 15 by respective solder joints. These two solder joints as well as the coupling wire 16 each exhibit inherent parasitic resistance. The sum of the inherent parasitic resistance of the coupling wire 16 and the two solder joints between the common voltage reference rail 14 and the ground reference pin 15 is represented in FIGS. 1, 2 and 3 by the resistance $R_p$.

Current from the op-amps 7 is sunk to the ground reference pin 15 through the common voltage reference rail 14 and the coupling wire 16, and as the output voltage signals on the primary outputs 8 of the respective op-amps 7 vary due to changes in their respective input voltage signals with time, the currents sunk to the ground reference pin 15 from the respective op-amps 7 also vary with time. Due to the inherent resistance $R_p$ of the coupling wire 16 and the solder joints, a voltage drop develops between the common voltage reference rail 14 and the ground reference pin 15, which is proportional to the current flowing through the coupling wire 16. Thus, as the digital input words to the respective DACs 2a to 2h change with time, the output voltage signals on the primary outputs 8 of the op-amps 7a to 7h correspondingly change with time, thus imposing a time varying signal on the common voltage rail 14 relative to the ground reference pin 15. Accordingly, the voltage reference on the common voltage reference rail 14 is not a true ground reference, but rather, is a time varying voltage reference relative to the true ground reference on the ground reference pin 15. The op-amps 7 as will be described below include correction for the time varying voltage reference, in the output voltage signals on the primary outputs 8 of the respective op-amps 7.

As well as the digital input port 3, the output pins 9a and 9h, and the ground reference pin 15, the integrated circuit 1 comprises a supply voltage reference pin 20 for facilitating coupling of the integrated circuit 1 to a supply voltage $V_{dd}$ for providing a supply voltage $V_{dd}$ to the respective DACs 2a to 2h and the respective op-amps 7a to 7h. Other appropriate pins (not shown) are provided to the integrated circuit 1 for supplying other voltages, master clock signals and the like, which will be well known to those skilled in the art.

Figure 2:
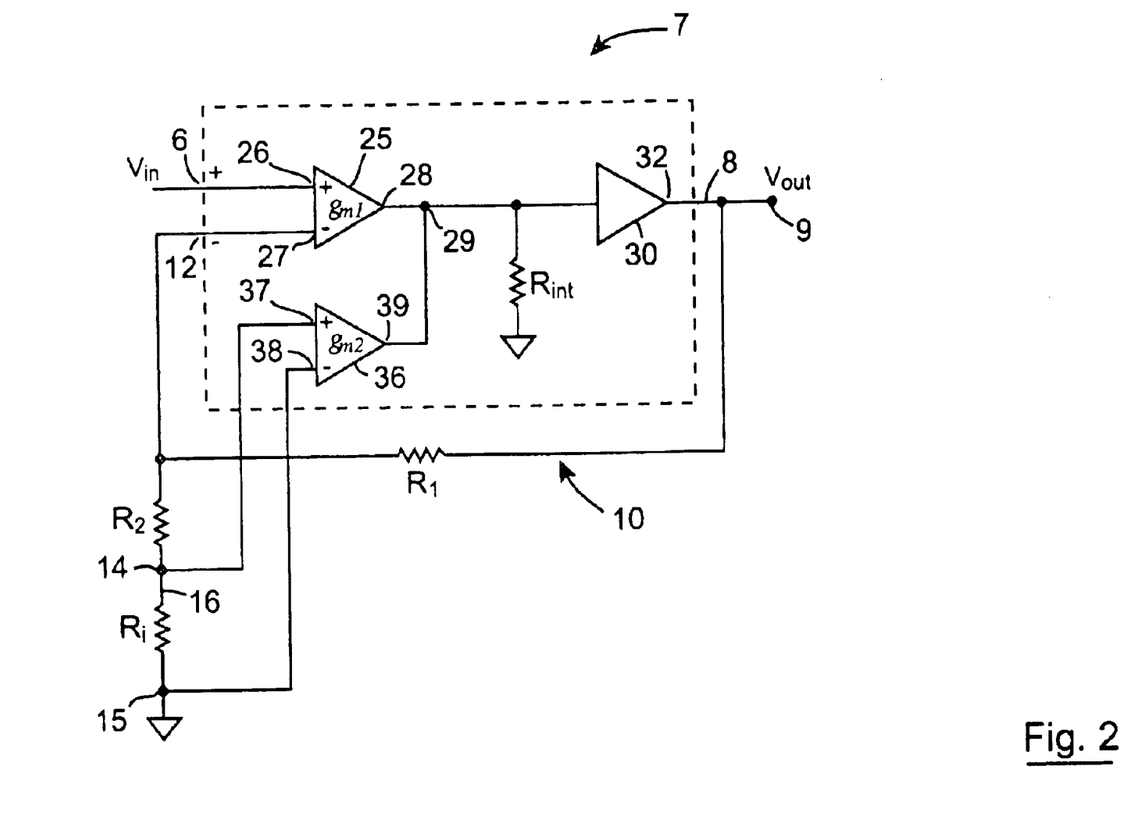
FIG. 2 is a block representation of one of the op-amps of FIG. 1.
Figure 3:
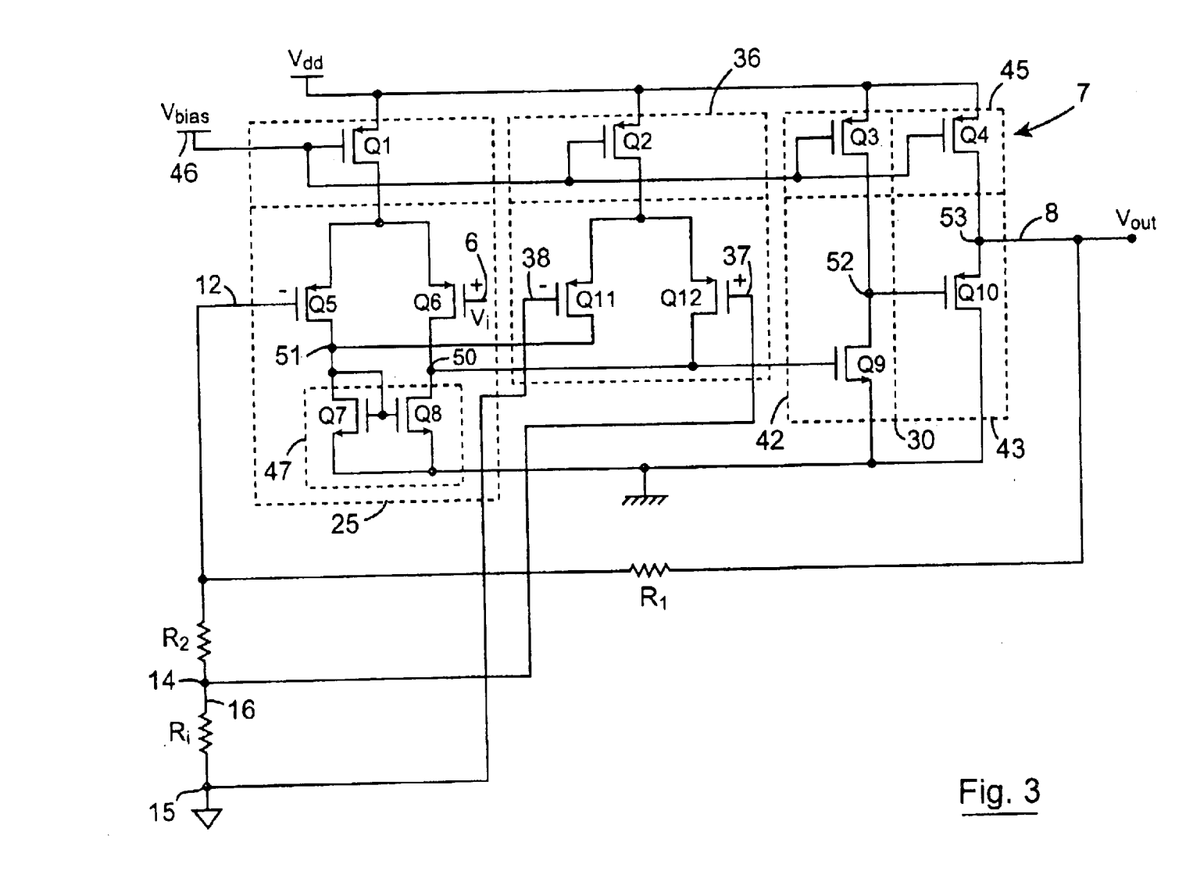

Referring now to FIG. 2, there is illustrated a block representation of one of the op-amps 7 of the integrated circuit 1. Since the op-amps 7a to 7h are identical, only one of the op-amps 7 will be described. Each op-amp 7 comprises a primary differential input amplifier stage 25 operable with a transconductance $g_{ml}$, and comprises a non-inverting input 26 and an inverting input 27. The non-inverting input 26 and the inverting input 27 define the primary non-inverting input 6 and the primary inverting input 12, respectively, of the op-amp 7. The primary differential input amplifier stage 25 provides an intermediate current signal through an output 28 to a node 29 which is equal to the product of the transconductance $g_{ml}$ of the primary differential input amplifier stage 25 multiplied by the difference of the analog input voltages applied to the non-inverting input 26 and the inverting input 27 of the primary differential input amplifier stage 25. In other words, the intermediate current signal provided by the primary differential input amplifier stage 25 to the node 29 is equal to $g_{ml}(V_{in}-V_x)$, where $V_{in}$ is the voltage of the input signal applied to the primary non-inverting input 6 of the op-amp 7, and $V_x$ is the voltage fed back to the primary inverting input 12.

An output buffer stage 30 of the op-amp 7, which is described in more detail below with reference to FIG. 3, is coupled to the node 29, and converts the current received from the node 29 to provide the output voltage signal on an output 32. The output 32 of the output stage 30 defines the primary output 8 of the op-amp 7. A resistor $R_{int}$ represents the internal impedance of the op-amp 7.

A secondary differential input amplifier stage 36 having a transconductance $g_{m2}$ is provided in each op-amp 7 for providing a secondary current signal to the node 29, which is responsive to variation in the time varying voltage reference on the rail 14 relative to the true ground reference on the ground reference pin 15. The secondary current signal is summed with the intermediate current signal from the primary differential input amplifier stage 25 in the node 29 for providing correction in the output voltage signal on the primary output 8 for the time varying voltage reference. The secondary differential input amplifier stage 36 comprises a non-inverting input 37 and an inverting input 38. The non-inverting input 37 is coupled to the common voltage reference rail 14, and the inverting input 38 is coupled to the ground reference pin 15. The secondary differential input amplifier stage 36 provides the secondary current signal on an output 39 to the node 29. The summed intermediate and secondary current signals are applied to the output stage 30, where they are converted for providing the output voltage signal on the primary output 8 with correction for the time varying voltage reference on the common voltage reference rail 14. The value of the secondary current signal is equal to the product of the transconductance $g_{m2}$ of the secondary differential input amplifier stage 36 multiplied by the voltage difference between the common voltage reference rail 14 and the ground reference pin 15.

Before describing the operational amplifier 7 in further detail, the theory behind the provision of the secondary differential amplifier stage 36 will first be described.

The output voltage $V_{out}$ on the primary output 8 of each op-amp 7 is given by the equation:

$$V_{out} = \frac{A_v \cdot V_{in}}{1 + A_v \cdot \frac{R2 + R_p}{R1 + R2 + R_p} - A_c \cdot \frac{R_p}{R1 + R2 + R_p}} + \frac{I_p}{R1 + R2 + R_p} \cdot \left[ \frac{A_c \cdot (R1 + R2) \cdot R_p - A_v \cdot R1 \cdot R_p}{1 + A_v \cdot \frac{R2 + R_p}{R1 + R2 + R_p} - A_c \cdot \frac{R_p}{R1 + R2 + R_p}} \right] \quad (1)$$

where $V_{in}$ is the input voltage signal applied to the primary non-inverting input 6 of the op-amp 7, $A_v$ is the open loop gain of the op-amp through the primary differential input amplifier stage 25, $A_c$ is the open loop gain of t he op-amp through the secondary differential input amplifier stage 36, $R_1$ is the resistance of the first resistor $R_1$, $R_2$ is the resistance of the second resistor $R_2$, $R_p$ is the inherent parasitic resistance between the common voltage reference rail 14 and the ground reference pin 15, and $I_p$ is the current flowing through the coupling wire 16.

The first term of equation (1) represents the portion of the output voltage signal on the primary output 8 of the op-amp which corresponds to the gained up input voltage signal on the primary non-inverting input 6 of the op-amp 7 with a small gain error, which results from the presence of the secondary differential input amplifier stage 36. The second term in equation (1) represents the component in the output voltage signal on the primary output 8 of the op-amp 7 caused by the voltage drop between the common voltage reference rail 14 and the ground reference pin 15. It is this term which is time variable and which causes the cross-talk between the primary outputs 8 of the op-amps 7, since this term is dependent on the current $I_p$ flowing through the coupling wire 16.

Accordingly, to minimise the effect of variations in the current $I_p$ flowing through the coupling wire 16, the second term in the equation should be reduced to zero or as close to zero as possible. Accordingly, to reduce the second term of equation (1) to zero, the following equation must be satisfied:

$$A_c \cdot (R1+R2) \cdot R_p - A_v \cdot R1 \cdot R_p = 0 \quad (2)$$

Equation (2) can be rewritten as:

$$A_c = \frac{A_v \cdot R_1 \cdot R_p}{(R_1 + R_2) \cdot R_p} \quad (3)$$

which reduces to:

$$A_c = A_v \cdot \frac{R_1}{R_1 + R_2} \quad (4)$$

Since $R_{int}$ represents the internal impedance of the op-amp 7, by definition:

$$A_v = R_{int} \cdot g_{m1}, \text{ and}$$

$$A_c = R_{int} \cdot g_{m2}.$$

substituting for $A_v$, and $A_c$ in equation (4) gives:

$$g_{m2} = g_{m1} \cdot \frac{R_1}{R_1 + R_2} \quad (5)$$

The closed loop gain G of the op-amp when configured in the non-inverting mode is given by the equation:

$$G = \frac{R_1 + R_2}{R_2}$$

Therefore:

$$g_{m2} = g_{m1} \cdot \left[ 1 - \frac{1}{G} \right] \quad (6)$$

Accordingly, the second term of equation (1) is eliminated when the transconductance $g_{m2}$ of the secondary differential input amplifier stage 36 is equal to the transconductance of the primary differential input amplifier stage 25 less the quotient of the transconductance of the primary differential input amplifier stage 25 divided by the closed loop gain of the op-amp 7.

In computer simulations, it has been found that op-amps according to the invention configured in a non-inverting mode with closed loop gains of two and five, the effect of the time varying voltage reference on the voltage output $V_{out}$ of the op-amp is virtually entirely eliminated. This is discussed in more detail below with reference to FIGS. 4 and 5.

Referring now to FIG. 3, a practical implementation of the op-amp 7 according to the invention will now be described. However, it will be readily apparent to those skilled in the art that many other practical implementations of the op-amp according to the invention may be provided, and the following description is not to be considered in any way limiting the scope of the invention. The op-amp 7 of FIG. 3 comprises the primary differential input amplifier stage 25, the secondary differential input amplifier stage 36, and the output stage 30, which in this embodiment of the invention comprises a second gain stage 42 and a buffer stage 43 with a gain of one. Although the output stage 30 may only comprise the buffer stage 43 if the gain provided by the primary differential input amplifier stage 25 is sufficient. A constant current source circuit 45 provided by a current mirror circuit comprising four MOS transistors Q1, Q2, Q3 and Q4 supplied by the supply voltage $V_{dd}$ provides constant currents to the respective stages 25, 36, 42 and 43 of the op-amp 7. A voltage bias terminal 46 is provided for receiving a bias voltage $V_{bias}$ for setting the constant currents through the transistors Q1 to Q4 of the constant current source circuit 45 at the desired values.

The primary differential input amplifier stage 25 comprises a first differential pair comprising matched first and second MOS transistors Q5 and Q6, respectively, and a first current mirror circuit 47 comprising matched MOS transistors Q7 and Q8. The gate of the first MOS transistor Q5 of the first differential pair defines the primary inverting input 12 of the primary differential input stage 25, while the gate of the second MOS transistor Q6 defines the primary non-inverting input 6. The second transistor Q6 of the first differential pair defines a first node 50 with the transistor Q8 of the first current mirror circuit 47. The first node 50 forms the output 28 through which the intermediate current signal is provided from the primary differential input amplifier stage 25 to the output stage 30, and thus the first node 50 effectively forms the node 29 of FIG. 2. The first transistor Q5 of the first differential pair defines a second node 51 with the first current mirror circuit 47.

The second gain stage 42 comprises a MOS transistor Q9, and the buffer stage 43 comprises a MOS transistor Q10. The gate of the transistor Q9 of the second gain stage 42 is coupled to the first node 50, and the transistor Q9 acts as a driver device for providing a current through a node 52 of the second gain stage 42. The current through the node 52 is applied to the gate of the transistor Q10 of the buffer stage 43, which acts as a source follower of the buffer circuit 43. The output voltage signal of the op-amp 7 is provided on an output node 53 in the buffer stage 43 to the primary output 8. Insofar as the op-amp 7 has been described up to here with reference to FIG. 3, its construction and operation will be well known to those skilled in the art.

The secondary differential input amplifier stage 36 comprises a second differential pair provided by matched third and fourth MOS transistors Q11 and Q12, respectively, and a transconductance appropriately selected relative to the transconductance of the primary differential input amplifier stage 25 in accordance with equation (6). The gate of the third transistor Q11 of the second differential pair defines the inverting input 38 of the secondary differential input amplifier stage 36, which is coupled to the ground reference pin 15. The gate of the fourth transistor Q12 of the second differential pair of the secondary differential amplifier stage 36 defines the non-inverting input 37 of the secondary differential input amplifier stage 36 which is coupled to the common voltage reference rail 14. The third and fourth transistors Q11 and Q12 of the second differential pair of the secondary differential input amplifier stage 36 share the first current mirror circuit 47 of the primary differential input amplifier stage 25. The third and fourth transistors Q11 and Q12 of the second differential pair of the secondary differential input amplifier stage 36 define with the first current mirror circuit 47 third and fourth nodes, which in this embodiment of the invention coincide with the first and second nodes 50 and 51. The secondary differential input amplifier stage 36 provides the secondary current signal through the first node 50 to the gate of the transistor Q9 of the second gain stage 42, which is responsive to the time varying voltage reference on the common voltage reference rail 14. The intermediate and secondary current signals are summed in the first node 50, and are applied to the gate of the transistor Q9 of the second gain stage 42.

The sources of the transistors Q7, Q8 and Q9 are connected to ground, and the drain of the transistor Q10 is connected to ground.

The operation of the primary and secondary differential input amplifier stages and 36 is as follows. An increase in the time varying voltage reference on the common voltage reference rail 14 causes an increase in the intermediate current flowing through the first node 50 from the primary differential input amplifier stage to the second gain stage 42. This in turn in the absence of the secondary differential amplifier stage 36 would lead to a decrease in voltage at the node 52, which in turn would lead to a decrease in the output voltage signal $V_{out}$ on the primary output 8 via the transistor Q10, and thus cross-talk. However, the increase in the time varying voltage reference causes an imbalance in the second differential pair of transistors Q11 and Q12 of the secondary differential input amplifier stage 36, which provides the secondary current signal flowing through the first node 50 which flows in the opposite direction to the increase in the intermediate current resulting from the increase in the time varying voltage reference. In other words, the imbalance caused to the second differential pair of transistors Q11 and Q12 by the increase in the time varying voltage reference causes an increase in the current flowing through the third transistor Q11 and a decrease in the current flowing through the fourth transistor Q12. The increase in the current flowing through the third transistor Q11 and the decrease in the current flowing through the fourth transistor Q 12 compensates for the imbalance in the first differential pair of transistors Q5 and Q6 of the primary differential input amplifier stage 25 resulting from the increase in the time varying voltage reference. Thereby, rendering the output voltage of the signal on the primary output 8 substantially independent of the time varying voltage reference on the common voltage reference rail 14, and in turn avoiding cross-talk. A decrease in the time varying voltage reference on the common voltage reference rail 14 causes the intermediate and secondary currents to be reversed, thereby an imbalance in the first differential pair of transistors Q5 and Q6 is compensated for by a corresponding imbalance in the second differential pair of transistors Q11 and Q12, and the output voltage signal on the primary output 8 is also rendered substantially independent of the time varying voltage reference on the common voltage reference rail 14, similarly avoiding cross-talk.

Figure 4A:
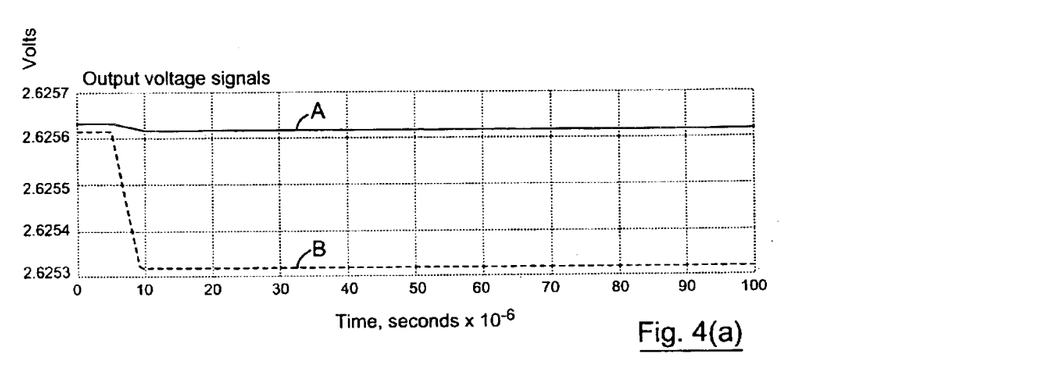
Figure 4B:
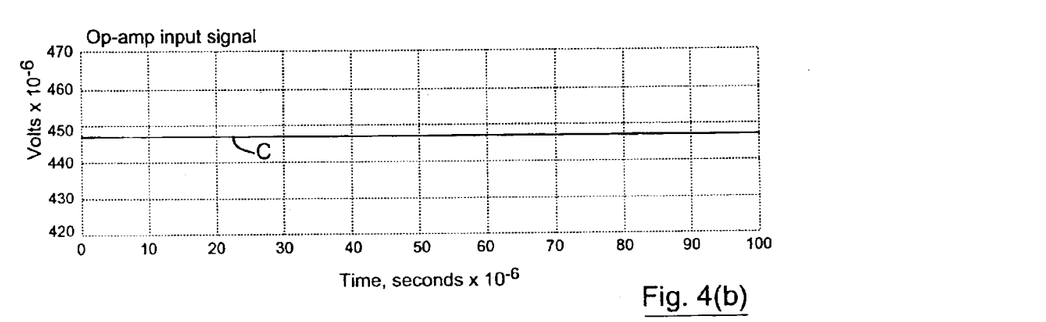
Figure 4C:
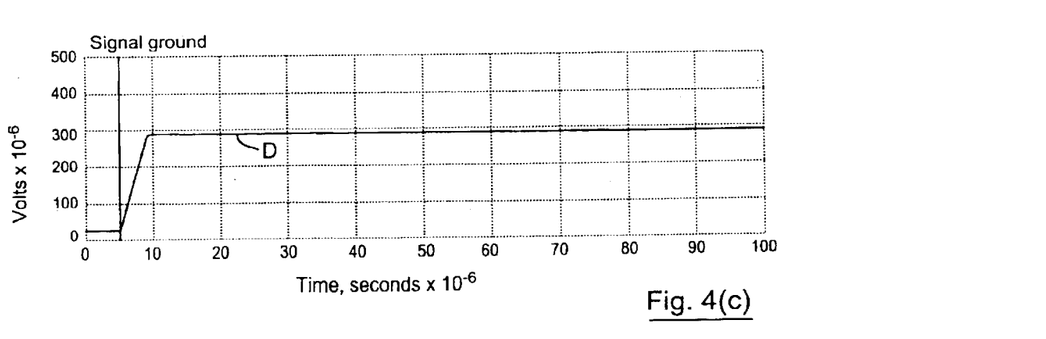

Referring now to FIGS. 4(a) to 4(c), there is illustrated waveforms resulting from computer simulated comparative tests carried out on a computer simulation of an op-amp 7 configured in the non-inverting mode with a closed loop gain of two as already described, and a computer simulation of a conventional prior art op-amp similar to the op-amp according to the invention but without the secondary differential input stage. The prior art op-amp was similarly configured in a non-inverting mode with a closed loop gain of two. In the simulation both the op-amp according to the invention and the prior art op-amp were coupled to the same common voltage reference rail and were subjected to the same time varying voltage on the common voltage reference rail. The input signal to both op-amps were identical. In each of FIGS. 4(a) to 4(c) the X-axis represents time in seconds by $10^{-6}$, namely, microseconds. The Y-axis of each of FIGS. 4(a) to 4(c) represents voltage, and in FIG. 4(a) the voltage is represented in volts, while in FIGS. 4(b) and 4(c) the voltages are represented in volts by $10^{-6}$, namely, microvolts. The waveform A of FIG. 4(a) represents the output voltage signal on the primary output 8 of the op-amp according to the invention. The waveform B of FIG. 4(a) represents the output voltage signal on the primary output of the prior art op-amp. The waveform C of FIG. 4(b) represents the voltage of the input signal applied to the op-amp 7 according to the invention and the prior art op-amp, which was maintained constant. The waveform D of FIG. 4(c) represents the time varying voltage on the common voltage reference rail.

From the waveform D of FIG. 4(c) it can be seen that the time varying voltage reference on the common voltage reference rail between time 5 microseconds and 9 microseconds increased linearly from approximately 20 microvolts to 280 microvolts. The input signal on the primary non-inverting inputs of the op-amp according to the invention and the prior art op-amp was maintained constant at approximately 448 microvolts. The output voltage signal on the primary output of the op-amp according to the invention stayed substantially constant, and dropped by approximately 20 microvolts from approximately 2.625635 volts to approximately 2.625615 volts. In other words, the voltage drop in the output voltage signal was only 1 microvolt, and was thus virtually unaffected by the change in the time varying voltage reference on the common voltage reference rail between time 5 microseconds and 9 microseconds. Thereby, cross-talk is eliminated. However, as can be seen, the output voltage signal on the primary output of the prior art op-amp dropped from approximately 2.625615 volts to approximately 2.62532 volts, a drop of approximately 295 microvolts, as a result of the step change in the time varying voltage reference on the common voltage reference rail. This variation in the voltage of the output voltage signal represents cross-talk. Accordingly, it can be seen from FIGS. 4(a) to 4(c) that the output voltage on the primary output of the op-amp according to the invention was virtually entirely unaffected by the change in the time varying voltage reference on the common voltage reference rail. However, the gain of the op-amp according to the invention was slightly increased by the inclusion of the secondary differential input amplifier stage 36 over and above the gain of the prior art op-amp. This is acceptable.

Figure 5A:
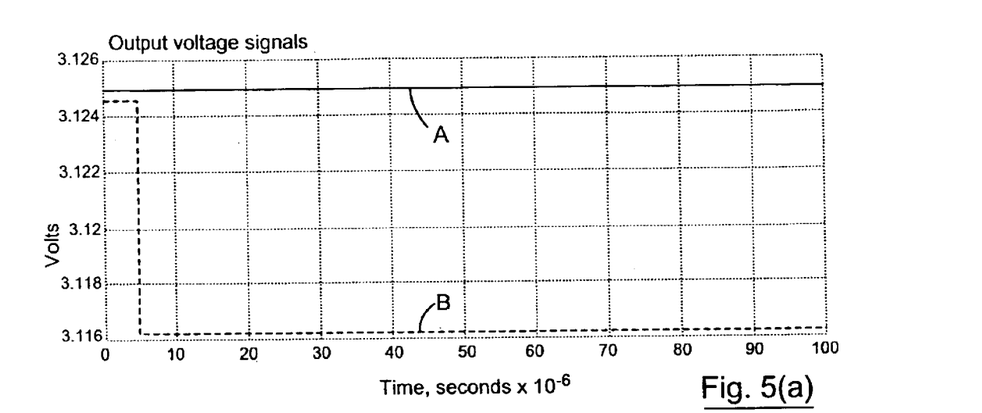
FIGS. 5(a) to 5(c) are waveforms of voltage signals resulting from computer simulated comparative tests comparing the performance of another op-amp according to the invention with that of a prior art op-amp.
Figure 5B:
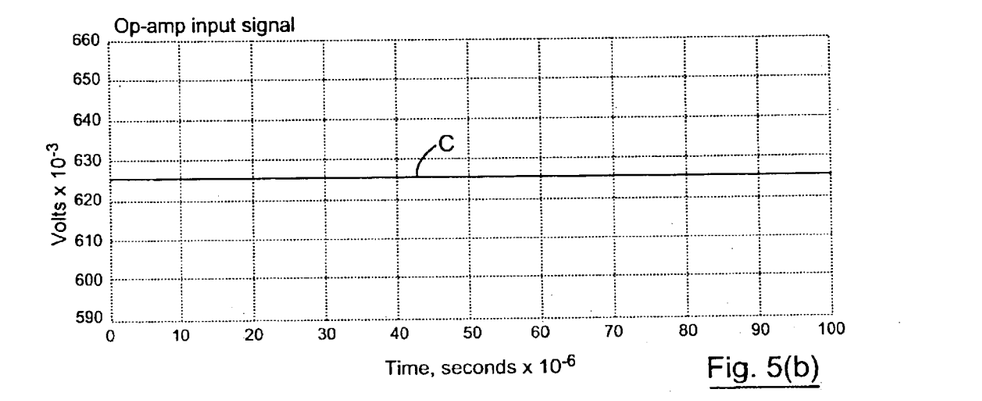
Figure 5C:
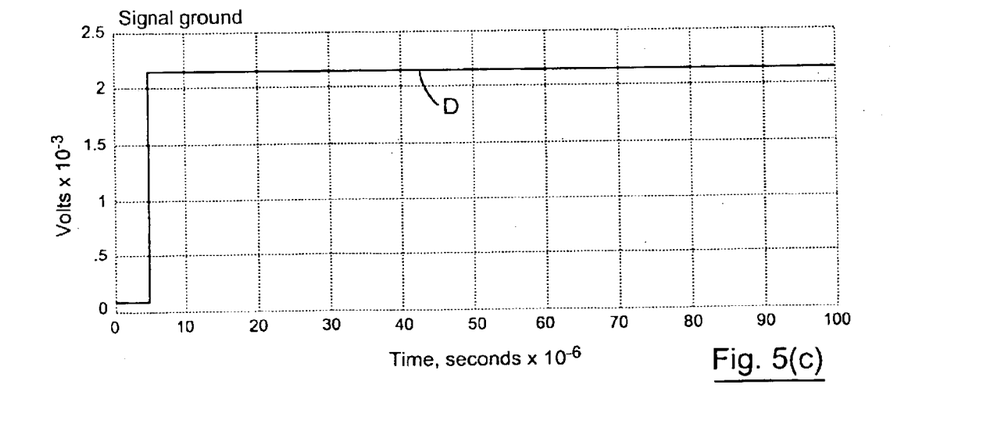

Referring now to FIGS. 5(a) to 5(c), there is illustrated waveforms resulting from computer simulated comparative tests carried out on a computer simulation of an op-amp according to the invention and similar to the op-amp 7, configured in the non-inverting mode, but with a closed loop gain of five, and a computer simulation of a conventional prior art op-amp similar to the op-amp according to the invention but without the secondary differential input stage. The prior art op-amp was similarly configured in the non-inverting mode with a closed loop gain also of five. In the simulation both the op-amp according to the invention and the prior art op-amp were coupled to the same common voltage reference rail and were subjected to the same time varying voltage reference on the common voltage reference rail. The input signal to both op-amps were identical. In each of FIGS. 5(a) to 5(c) the X-axis represents time in seconds by $10^{-6}$, namely, microseconds. The Y-axis of each of FIGS. 5(a) to 5(c) represents voltage, and in FIG. 5(a) the voltage is represented in volts, while in FIGS. 5(b) and 5(c) the voltages are represented in volts by $10^{-3}$, namely, millivolts. The waveform A of FIG. 5(a) represents the output voltage signal on the primary output 8 of the op-amp according to the invention. The waveform B of FIG. 5(a) represents the output voltage signal on the primary output of the prior art op-amp. The waveform C of FIG. 5(b) represents the voltage of the input signal applied to the op-amp according to the invention and the prior art op-amp, which was maintained constant. The waveform D of FIG. 5(c) represents the time varying voltage on the common voltage reference rail.

From the waveform D of FIG. 5(c) it can be seen that the time varying voltage reference on the common voltage reference rail at time 5 microseconds increased in a step change from approximately 0.1 millivolts to 2.15 millivolts. The input signal on the primary non-inverting inputs of the op-amp according to the invention and the prior art op-amp was maintained constant at approximately 625 millivolts. The output voltage signal on the primary output of the op-amp according to the invention stayed constant at approximately 3.125 volts, and was unaffected by the step change in the time varying voltage reference on the common voltage reference rail at time 5 microseconds. While there may have been a minuscule change in the voltage of the output voltage signal of the op-amp according to the invention, it was too small to be detected, and would not cause cross-talk. However, as can be seen, the output voltage signal on the primary output of the prior art op-amp dropped from approximately 3.1247 volts to approximately 3.1162 volts, a drop of approximately 8.5 millivolts, as a result of the step change in the time varying voltage reference on the common voltage reference rail. This variation in the voltage in the output voltage signal represents cross-talk. Accordingly, it can be seen from FIGS. 5(a) to 5(c) that the output voltage on the primary output of the op-amp according to the invention was virtually entirely unaffected by the step change in the time varying voltage reference on the common voltage reference rail. However, the gain of the op-amp according to the invention was slightly increased by the inclusion of the secondary differential input amplifier stage 36 over and above the gain of the prior art op-amp. This is acceptable.

While as can be seen from the waveforms of FIGS. 4(a) to 4(c) the inclusion of the secondary differential amplifier stage 36 in the op-amp according to the invention did not entirely correct the output voltage signal for variation in the time varying voltage reference when the gain of the op-amp was two, the effect of the time varying voltage reference on the output voltage signal was significantly reduced, and was reduced to a level where cross-talk between the outputs of the op-amps is effectively eliminated.

However, from FIG. 5 it can be seen that when the op-amp according to the invention was configured with a closed loop gain of five, the effect of the time varying voltage reference on the common voltage reference rail on the output voltage signal of the op-amp was eliminated.

However, while the inclusion of the secondary differential input amplifier stage which is responsive to the time varying voltage reference substantially eliminates cross-talk, from the first term in equation (1) it will be appreciated that if the inherent parasitic resistance between the common voltage reference rail 14 and the true ground reference pin 15 becomes excessively large, gain problems with the gain of the op-amp will arise.

While the op-amps according to the invention have been described as being included in an integrated circuit for amplifying output voltage signals from corresponding DACs, the op-amps according to the invention may be used for amplifying other signals. Additionally, while the op-amp according to the invention has been described as being configured with a closed loop gain of two, the op-amp may be configured with a closed loop gain of any desired value.

While a specific circuit implementation of the op-amp according to the invention has been described with reference to FIG. 3, many other circuit implementations of the op-amp are possible within the scope of the invention. It will be appreciated that while the secondary differential input amplifier stage has been described as comprising a second differential pair which share the first constant current circuit with the first differential pair of the primary differential input amplifier stage, the secondary differential input amplifier stage may be provided with a separate current mirror circuit coupled to the second differential pair. Additionally, the op-amp may include additional gain stages between the primary differential input amplifier stage and the second gain stage.

While op-amps according to the invention have been described as being configured with closed loop gains of two and five, it will be readily apparent to those skilled in the art that the op-amps according to the invention may be configured with any desired closed loop gain. However, when providing the op-amps the transconductance of the secondary differential input amplifier stage will be appropriately selected relative to the transconductance of the primary differential input amplifier stage and the desired closed loop gain of the op-amp in accordance with equation (6).

What is claimed is:

1. An operational amplifier (op-amp) configurable in a non-inverting mode with a closed loop gain greater than one, and with correction in an output signal of the op-amp for a time varying voltage reference of the op-amp relative to a true voltage reference, the op-amp comprising:

a primary output for providing the output signal gained up from an input signal, a primary differential input amplifier stage operable with a transconductance and having a non-inverting input defining a primary non-inverting input of the op-amp for receiving the input signal, an inverting input defining a primary inverting input of the op-amp for coupling to a feedback loop from the primary output, and an output for providing an intermediate current signal from which the output signal on the primary output is derived, and a secondary differential input amplifier stage operable with a transconductance, and responsive to the time varying voltage reference for providing a secondary current signal responsive to variation in the time varying voltage reference relative to the true voltage reference for summing with the intermediate current signal provided by the primary differential input amplifier stage, the transconductance of the secondary differential input amplifier stage being a function of the transconductance of the primary differential input amplifier stage, so that the output signal on the primary output derived from the sum of the intermediate and secondary currents includes correction for the time varying voltage reference.

2. An op-amp as claimed in claim 1 in which the secondary differential input amplifier stage comprises a non-inverting input for coupling to the time varying voltage reference, and an inverting input for coupling to the true voltage reference.

3. An op-amp as claimed in claim 1 in which the secondary differential input amplifier stage comprises an output for providing the secondary current signal, the output of the secondary differential input amplifier stage being coupled to the output of the primary differential input amplifier stage.

4. An op-amp as claimed in claim 1 in which the transconductance of the secondary differential input amplifier stage is a function of the closed loop gain of the op-amp and the transconductance of the primary differential input amplifier stage.

5. An op-amp as claimed in claim 1 in which the transconductance of the secondary differential input amplifier stage is substantially equal to the transconductance of the primary differential input amplifier stage less the quotient of the transconductance of the primary differential input amplifier stage divided by the closed loop gain of the op-amp.

6. An op-amp as claimed in claim 1 in which the op-amp is configured with a closed loop gain greater than one, and a feedback loop comprising a first impedance element is provided coupling the primary output and the primary inverting input of the op-amp, a second impedance element being provided for coupling the primary inverting input with the time varying voltage reference, the second impedance element co-operating with the first impedance element for setting the closed loop gain of the op-amp.

7. An op-amp as claimed in claim 6 in which the ratio of the impedance of the first impedance element to the impedance of the second impedance element is approximately 1.

8. An op-amp as claimed in claim 6 in which each of the first and second impedance elements are resistive elements.

9. An op-amp as claimed in claim 1 in which the primary differential input stage of the op-amp comprises:

a first differential pair having a first transistor, a gate of which defines the primary non-inverting input, and a second transistor, a gate of which defines the primary inverting input, a first current mirror circuit coupled to the first differential pair and defining with the first transistor a first node, and with the inverting transistor a second node, the first node defining the output of the primary differential input amplifier stage, and a first constant current source for providing a constant current to the first differential pair.

10. An op-amp as claimed in claim 9 in which the secondary differential input amplifier stage comprises:

a second differential pair having a third transistor, a gate of which defines the non-inverting input of the secondary differential input amplifier stage, and a fourth transistor, a gate of which defines the inverting input of the secondary differential input amplifier stage, the differential pair being coupled to a current mirror circuit, which defines with the third transistor a third node, and with the fourth transistor a fourth node, the third node defining the output of the secondary differential input amplifier stage, and being coupled to the first node of the primary differential input amplifier stage, and a second constant current source for providing a constant current to the second differential amplifier pair.

11. An op-amp as claimed in claim 10 in which the fourth node of the secondary differential input amplifier stage is coupled to the second node of the primary differential input amplifier stage.

12. An op-amp as claimed in claim 10 in which the current mirror circuit to which the second differential pair is coupled is the first current mirror circuit of the primary differential input amplifier stage.

13. An op-amp as claimed in claim 1 in which the op-amp is implemented as an integrated circuit by a CMOS process.

14. An op-amp configured in a non-inverting mode with a closed loop gain greater than one, and referenced to a time varying voltage reference relative to a true voltage reference, with correction in an output signal of the op-amp for the time varying voltage reference, the op-amp comprising:

a primary output for providing the output signal gained up from a corresponding input signal, a primary differential input amplifier stage operable with a transconductance and having a non-inverting input defining a primary non-inverting input of the op-amp for receiving the corresponding input signal, an inverting input defining a primary inverting input of the op-amp, and an output for providing an intermediate current signal from which the output signal on the corresponding primary output is derived, a feedback loop coupling the primary output with the primary inverting input, a secondary differential input amplifier stage operable with a transconductance, and responsive to the time varying voltage reference for providing a secondary current signal responsive to variation in the time varying voltage reference relative to the true voltage reference for summing with the intermediate current signal provided by the primary differential input amplifier stage, the transconductance of the secondary differential input amplifier stage of the op-amp being a function of the transconductance of the primary differential input amplifier stage of the op-amp, so that the output signal on the primary output of the op-amp, which is derived from the sum of the corresponding intermediate and secondary currents includes correction for the time varying voltage reference.

15. An op-amp as claimed in claim 14 in which the feedback loop comprising a first impedance element, and a second impedance element is provided for coupling the primary inverting input with the time varying voltage reference, the second impedance element co-operating with the first impedance element for setting the closed loop gain of the op-amp.

16. An op-amp as claimed in claim 15 in which each of the first and second impedance elements are resistive elements.

17. A circuit comprising a plurality of op-amps, each op-amp being configured in a non-inverting mode with a closed loop gain greater than one, and referenced to a time varying voltage reference relative to a true voltage reference, with correction in an output signal of each op-amp for the time varying voltage reference, each op-amp comprising:

a primary output for providing the output signal gained up from a corresponding input signal, a primary differential input amplifier stage operable with a transconductance and having a non-inverting input defining a primary non-inverting input of the op-amp for receiving the corresponding input signal, an inverting input defining a primary inverting input of the op-amp, and an output for providing an intermediate current signal from which the output signal on the corresponding primary output is derived, a feedback loop coupling the primary output with the primary inverting input, a secondary differential input amplifier stage operable with a transconductance, and responsive to the time varying voltage reference for providing a secondary current signal responsive to variation in the time varying voltage reference relative to the true voltage reference for summing with the intermediate current signal provided by the primary differential input amplifier stage, the transconductance of the secondary differential input amplifier stage of each op-amp being a function of the transconductance of the primary differential input amplifier stage of the corresponding op-amp, so that the output signal on the primary output of the corresponding op-amp, which is derived from the sum of the corresponding intermediate and secondary currents includes correction for the time varying voltage reference.

18. A circuit as claimed in claim 17 in which a plurality of digital-to-analog converters are provided corresponding the respective op-amps, each digital-to-analog converter having an analog output for outputting an analog signal corresponding to a respective digital input word, the analog output of each digital-to-analog converter being coupled to the primary non-inverting input of the corresponding op-amp, so that the output signal provided by each op-amp is gained up from the analog signal of the corresponding digital-to-analog converter with correction for the time varying voltage reference.

19. A circuit as claimed in claim 17 in which a common voltage reference rail is provided, and the op-amps are referenced to the common voltage reference rail, the common voltage reference rail being coupled to the true voltage reference through a coupling means having inherent impedance, so that as the output signals through the primary outputs of the respective op-amps vary in response to variation in the corresponding input signals, current through the coupling means varies, thereby inducing the time varying voltage reference in the common voltage reference rail.

20. A circuit as claimed in claim 17 in which the circuit is implemented as an integrated circuit by a CMOS process, the circuit comprising a voltage reference pin to which the true voltage reference is applied.

21. A method for providing correction in an output signal of an op-amp, configured in a non-inverting mode with a closed loop gain greater than one, for a time varying voltage reference of the op-amp relative to a true voltage reference, the op-amp comprising a primary output for providing the output signal gained up from an input signal, and a primary differential input amplifier stage operable with a transconductance and having a non-inverting input defining a primary non-inverting input of the op-amp for receiving the input signal, an inverting input defining a primary inverting input of the op-amp for coupling to a feedback loop from the primary output, and an output for providing an intermediate current signal from which the output signal on the primary output is derived, the method comprising the steps of:

providing a secondary differential input amplifier stage operable with a transconductance, and responsive to the time varying voltage reference for providing a secondary current signal responsive to variation in the time varying voltage reference relative to the true voltage reference for summing with the intermediate current signal provided by the primary differential input amplifier stage, and selecting the transconductance of the secondary differential input amplifier stage to be a function of the transconductance of the primary differential input amplifier stage, so that the output signal on the primary output derived from the sum of the intermediate and secondary currents includes correction for the time varying voltage reference.

22. A method as claimed in claim 21 in which the secondary differential input amplifier stage is provided with a non-inverting input, an inverting input and an output, and the method further comprises coupling the non-inverting input of the secondary differential input amplifier stage to the time varying voltage reference, coupling the inverting input of the secondary differential input amplifier stage to the true voltage reference, and coupling the output of the secondary differential input amplifier stage to the output of the primary differential input amplifier stage for summing the secondary current signal responsive to the time varying voltage reference through the output of the secondary differential input amplifier stage with the intermediate current signal through the output of the primary differential input amplifier stage.

23. A method as claimed in claim 21 in which the transconductance of the secondary differential input amplifier stage is selected to be a function of the closed loop gain of the op-amp and the transconductance of the primary differential input amplifier stage.

24. A method as claimed in claim 21 in which the transconductance of the secondary differential input amplifier stage is selected to be substantially equal to the transconductance of the primary differential input amplifier stage less the quotient of the transconductance of the primary differential input amplifier stage divided by the closed loop gain of the op-amp.

25. A method as claimed in claim 21 in which the feedback loop is provided and comprises a first impedance element coupled to the primary output and the primary inverting input of the op-amp, and a second impedance element couples the primary inverting input of the op-amp with the time varying voltage reference, the second impedance element co-operating with the first impedance element for setting the closed loop gain of the op-amp.

26. A method as claimed in claim 25 in which the ratio of the impedance of the first impedance element to the impedance of the second impedance element is approximately one.

27. A method as claimed in claim 25 in which each of the first and second impedance elements are resistive elements.

* * * * *